United States Patent
Wang et al.

(10) Patent No.: US 7,436,269 B2
(45) Date of Patent: Oct. 14, 2008

(54) ACOUSTICALLY COUPLED RESONATORS AND METHOD OF MAKING THE SAME

(75) Inventors: Kun Wang, Sunnyvale, CA (US); Paul D. Bradley, Los Altos, CA (US); Richard C. Ruby, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 85 days.

(21) Appl. No.: 11/109,596

(22) Filed: Apr. 18, 2005

(65) Prior Publication Data
US 2006/0232361 A1   Oct. 19, 2006

(51) Int. Cl.
H03H 9/70 (2006.01)
H03H 9/54 (2006.01)

(52) U.S. Cl. ...................... 333/133; 333/189
(58) Field of Classification Search ................. 333/133, 333/189
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandis et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,355,408 A | 10/1982 | Scarrott |

(Continued)

FOREIGN PATENT DOCUMENTS

DE     10160617     6/2003

(Continued)

OTHER PUBLICATIONS

Hans H. Schuessler, Ceramic Filters and Resonators Reprinted from IEEE Trans. Sonics Ultrason., vol. SU-21, pp. 257-268, Oct. 1974.

(Continued)

Primary Examiner—Barbara Summons

(57) ABSTRACT

An apparatus includes a substrate with a cavity and a two-stage resonator filter fabricated over the cavity. The two-stage resonator filter includes a first stage and a second stage. The first stage includes a first resonator and a second resonator, the second resonator acoustically coupled to the first resonator. The second stage includes a third resonator and a fourth resonator, the fourth resonator acoustically coupled to the third resonator. The second resonator and the third resonators are electrically coupled. A decoupling layer couples the first resonator and the second resonator. The decoupling layer extends between the third resonator and the fourth resonator. The first resonator and the fourth resonator are above the substrate. The decoupling layer is above the first resonator and the fourth resonator. The second resonator and the third resonators are above the decoupling layer.

6 Claims, 9 Drawing Sheets

U.S. PATENT DOCUMENTS

| | | |
|---|---|---|
| 4,456,850 A | 6/1984 | Inoue et al. |
| 4,529,904 A | 7/1985 | Hattersley |
| 4,625,138 A | 11/1986 | Ballato |
| 4,719,383 A | 1/1988 | Wang et al. |
| 4,798,990 A | 1/1989 | Henoch |
| 4,836,882 A | 6/1989 | Ballato |
| 4,841,429 A | 6/1989 | Mcclanahan et al. |
| 4,906,840 A | 3/1990 | Zdeblick et al. |
| 5,048,036 A | 9/1991 | Scifres et al. |
| 5,048,038 A | 9/1991 | Brennan et al. |
| 5,118,982 A | 6/1992 | Inoue et al. |
| 5,129,132 A | 7/1992 | Zdeblick et al. |
| 5,162,691 A | 11/1992 | Mariani et al. |
| 5,241,209 A | 8/1993 | Sasaki |
| 5,241,456 A | 8/1993 | Marcinkiewicz et al. |
| 5,294,898 A | 3/1994 | Dworsky et al. |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,587,620 A | 12/1996 | Ruby et al. |
| 5,589,858 A | 12/1996 | Kadowaki et al. |
| 5,594,705 A | 1/1997 | Connor et al. |
| 5,671,242 A | 9/1997 | Takiguchi et al. |
| 5,692,279 A | 12/1997 | Mang et al. |
| 5,714,917 A | 2/1998 | Ella |
| 5,853,601 A | 12/1998 | Krishaswamy et al. |
| 5,864,261 A | 1/1999 | Weber |
| 5,872,493 A | 2/1999 | Ella |
| 5,873,153 A | 2/1999 | Ruby et al. |
| 5,873,154 A | 2/1999 | Ylilammi et al. |
| 5,894,647 A | 4/1999 | Lakin |
| 5,910,756 A | 6/1999 | Ella |
| 5,936,150 A | 8/1999 | Kobrin et al. |
| 5,953,479 A | 9/1999 | Zhou et al. |
| 5,982,297 A | 11/1999 | Welle |
| 6,040,962 A | 3/2000 | Kanazawa et al. |
| 6,060,818 A | 5/2000 | Ruby et al. |
| 6,087,198 A | 7/2000 | Panasik |
| 6,107,721 A | 8/2000 | Lakin |
| 6,111,480 A | 8/2000 | Iyama et al. |
| 6,124,756 A | 9/2000 | Yaklin et al. |
| 6,150,703 A | 11/2000 | Cushman et al. |
| 6,187,513 B1 | 2/2001 | Katakura |
| 6,215,375 B1 | 4/2001 | Larson, III et al. |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,265,246 B1 | 7/2001 | Ruby et al. |
| 6,278,342 B1 | 8/2001 | Ella |
| 6,292,336 B1 | 9/2001 | Horng et al. |
| 6,307,447 B1 | 10/2001 | Barber et al. |
| 6,307,761 B1 | 10/2001 | Nakagawa |
| 6,376,280 B1 | 4/2002 | Ruby et al. |
| 6,377,137 B1 | 4/2002 | Ruby |
| 6,384,697 B1 | 5/2002 | Ruby |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Akihiko |
| 6,441,539 B1 | 8/2002 | Kitamura et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panaski |
| 6,550,664 B2 | 4/2003 | Bradley et al. |
| 6,564,448 B1 | 5/2003 | Oura et al. |
| 6,566,979 B2 | 5/2003 | Larson et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,600,390 B2 | 7/2003 | Frank |
| 6,601,276 B2 | 8/2003 | Barber |
| 6,617,249 B2 | 9/2003 | Ruby et al. |
| 6,617,750 B2 | 9/2003 | Dummermuth et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson et al. |
| 6,657,363 B1 | 12/2003 | Aigner |
| 6,668,618 B2 | 12/2003 | Larson et al. |
| 6,670,866 B2 | 12/2003 | Ellaet et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Piazza et al. |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,828,713 B2 | 12/2004 | Bradley et al. |
| 6,842,088 B2 | 1/2005 | Yamada et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,928 B2 | 8/2005 | Hedler et al. |
| 6,936,954 B2 | 8/2005 | Peczalski |
| 6,946,928 B2 | 9/2005 | Larson et al. |
| 6,954,121 B2 | 10/2005 | Bradley et al. |
| 6,963,257 B2 * | 11/2005 | Ella et al. .................. 333/133 |
| 6,975,183 B2 | 12/2005 | Aigner et al. |
| 6,977,563 B2 | 12/2005 | Komuro et al. |
| 6,985,052 B2 | 1/2006 | Tikka |
| 6,987,433 B2 | 1/2006 | Larson et al. |
| 6,989,723 B2 | 1/2006 | Komuro et al. |
| 6,998,940 B2 | 2/2006 | Metzger |
| 7,019,604 B2 | 3/2006 | Gotoh et al. |
| 7,019,605 B2 | 3/2006 | Larson et al. |
| 7,057,476 B2 | 6/2006 | Hwu |

| | | | | | | |
|---|---|---|---|---|---|---|
| 7,084,553 | B2 | 8/2006 | Ludwiczak | EP | 1096259 | 5/2001 |
| 7,091,649 | B2 | 8/2006 | Larson | EP | 1258990 | 11/2002 |
| 7,098,758 | B2 | 8/2006 | Wang et al. | EP | 1180494 | 3/2003 |
| 7,170,215 | B2 | 1/2007 | Namba et al. | EP | 1542362 | 6/2003 |
| 7,173,504 | B2 | 2/2007 | Larson | EP | 1258989 | 1/2004 |
| 7,187,254 | B2 | 3/2007 | Su et al. | EP | 1249932 | 3/2005 |
| 7,230,509 | B2 | 6/2007 | Stoemmer | EP | 1517443 | 3/2005 |
| 2002/0000646 | A1 | 1/2002 | Gooch et al. | EP | 1517444 | 3/2005 |
| 2002/0030424 | A1 | 3/2002 | Iwata | EP | 1 528 675 A1 | 5/2005 |
| 2002/0121944 | A1 | 9/2002 | Larson, III et al. | EP | 1528674 | 5/2005 |
| 2002/0121945 | A1 | 9/2002 | Ruby et al. | EP | 1528677 | 5/2005 |
| 2002/0152803 | A1 | 10/2002 | Larson, III et al. | EP | 1557945 | 7/2005 |
| 2002/0190814 | A1 | 12/2002 | Yamada et al. | EP | 1575165 | 9/2005 |
| 2003/0001251 | A1 | 1/2003 | Cheever et al. | GB | 1207974 | 10/1970 |
| 2003/0006502 | A1 | 1/2003 | Karpman | GB | 2411239 | 8/2005 |
| 2003/0087469 | A1 | 5/2003 | Ma | GB | 2418791 | 4/2006 |
| 2003/0102776 | A1 | 6/2003 | Takeda et al. | JP | 2002/217676 | 8/2002 |
| 2003/0111439 | A1 | 6/2003 | Fetter et al. | WO | WO-98/16957 | 4/1998 |
| 2003/0128081 | A1 | 7/2003 | Ella et al. | WO | WO-01/06647 | 1/2001 |
| 2003/0132493 | A1 | 7/2003 | Kang et al. | WO | WO-01/99276 | 12/2001 |
| 2003/0141946 | A1 | 7/2003 | Ruby et al. | WO | WO-02/103900 | 12/2002 |
| 2003/0179053 | A1 | 9/2003 | Aigner et al. | WO | WO-03/030358 | 4/2003 |
| 2004/0092234 | A1 | 5/2004 | Pohjonen | WO | WO-03/043188 | 5/2003 |
| 2004/0124952 | A1 | 7/2004 | Tikka | WO | WO-03/050950 | 6/2003 |
| 2004/0150293 | A1 | 8/2004 | Unterberger | WO | WO-03/058809 | 7/2003 |
| 2004/0150296 | A1 | 8/2004 | Park et al. | WO | WO-2004/034579 | 4/2004 |
| 2004/0195937 | A1 | 10/2004 | Matsubara et al. | WO | WO-2004/051744 | 6/2004 |
| 2004/0257172 | A1* | 12/2004 | Schmidhammer et al. ... 333/133 | WO | WO-2005/043752 | 5/2005 |
| 2004/0263287 | A1 | 12/2004 | Ginsburg et al. | WO | WO-2005/043753 | 5/2005 |
| 2005/0012570 | A1* | 1/2005 | Korden et al. ............... 333/189 | WO | WO-2005/043756 | 5/2005 |
| 2005/0023931 | A1 | 2/2005 | Bouche et al. | | | |
| 2005/0030126 | A1* | 2/2005 | Inoue et al. ................. 333/133 | | | |
| 2005/0036604 | A1 | 2/2005 | Scott et al. | | | |
| 2005/0057117 | A1 | 3/2005 | Nakatsuka et al. | | | |
| 2005/0057324 | A1 | 3/2005 | Onishi et al. | | | |
| 2005/0068124 | A1 | 3/2005 | Stoemmer | | | |
| 2005/0093396 | A1 | 5/2005 | Larson et al. | | | |
| 2005/0093653 | A1* | 5/2005 | Larson, III ................. 333/187 | | | |
| 2005/0093654 | A1 | 5/2005 | Larson et al. | | | |
| 2005/0093655 | A1 | 5/2005 | Larson et al. | | | |
| 2005/0093657 | A1* | 5/2005 | Larson et al. ............... 333/191 | | | |
| 2005/0093658 | A1* | 5/2005 | Larson et al. ............... 333/191 | | | |
| 2005/0093659 | A1 | 5/2005 | Larson et al. | | | |
| 2005/0104690 | A1 | 5/2005 | Larson | | | |
| 2005/0110598 | A1 | 5/2005 | Larson, III | | | |
| 2005/0128030 | A1 | 6/2005 | Larson et al. | | | |
| 2005/0140466 | A1 | 6/2005 | Larson, III et al. | | | |
| 2005/0167795 | A1 | 8/2005 | Higashi | | | |
| 2005/0193507 | A1 | 9/2005 | Ludwiczak | | | |
| 2005/0206271 | A1 | 9/2005 | Higuchi et al. | | | |
| 2005/0218488 | A1 | 10/2005 | Mie | | | |
| 2006/0087199 | A1 | 4/2006 | Larson et al. | | | |
| 2006/0103492 | A1 | 5/2006 | Feng et al. | | | |
| 2006/0132262 | A1 | 6/2006 | Fazzlo et al. | | | |
| 2006/0164183 | A1 | 7/2006 | Tikka | | | |
| 2006/0185139 | A1 | 8/2006 | Larson, III et al. | | | |
| 2007/0084964 | A1 | 4/2007 | John et al. | | | |
| 2007/0085447 | A1 | 4/2007 | Larson | | | |
| 2007/0085631 | A1 | 4/2007 | Larson et al. | | | |
| 2007/0085632 | A1 | 4/2007 | Larson et al. | | | |
| 2007/0086080 | A1 | 4/2007 | Larson et al. | | | |
| 2007/0086274 | A1 | 4/2007 | Nishimura et al. | | | |
| 2007/0090892 | A1 | 4/2007 | Larson | | | |
| 2007/0170815 | A1 | 7/2007 | Unkrich | | | |
| 2007/0171002 | A1 | 7/2007 | Unkrich | | | |

FOREIGN PATENT DOCUMENTS

| | | |
|---|---|---|
| EP | 0865157 | 9/1998 |
| EP | 0880227 | 11/1998 |
| EP | 0973256 | 1/2000 |
| EP | 1047189 | 10/2000 |
| EP | 1100196 | 11/2000 |

OTHER PUBLICATIONS

G. G. Fattinger, R. Aigner, and W. Nessler, Coupled Bulk Acoustic Wave Resonator Filters: Key technology for singe-to-balanced RF filters, 0-7803-8331-1/04/$20.00 © 2004 IEEE 2004 IEEE MTT-S Digest, pp. 927-929.

K.M. Lakin, Coupled Resonator Filters, IEEE 2002 Ultrasonics Symposium, Oct. 8-11, 2002, Paper 3D-5.

U.S. Appl. No. 10/971,169, filed Oct, 22, 2004, Larson III, John D., et al.

Holzlohner, Ronald et al., "Accurate Calculation of Eye Diagrams and Bit Error Rates in Optical Transmission Systems Using Linearization", *Journal of Lightwave Technology*, vol. 20, No. 3,, (Mar. 2002),pp. 389-400.

Reinhardt, Alexandre et al., "Design of Coupled Resonator Filters Using Admittance and Scattering Matrices", *2003 IEEE Ultrasonics Symposium*, (May 3, 2003),1428-1431.

Lobl, H.P. et al., "Piezoelectric Materials For BAW Resonators And Filters", *2001 IEEE Ultrasonics Symposium*, (Jan. 1, 2001),807-811.

Lakin, K.M. "Bulk Acoustic Wave Coupled Resonator Filters", *2002 IEEE International Frequency Control Symposium and PDA Exhibition*, (Jan. 2, 2002),8-14.

Jung, Jun-Phil et al., "Experimental And Theoretical Investigation On The Relationship Between AlN Properties And AlN-Based FBAR Characteristics", *2003 IEEE International Frequency Control Symposium and PDA Exhibition Jointly with the 17th European Frequency and Time Forum*, (Sep. 3, 2003),779-784.

Yang, C.M. et al., "Highly C Axis Oriented AlN Film Using MOCVD For 5GHx Band FBAR Filter", *2003 IEEE Ultrasonics Symposium*, (Oct. 5, 2003),pp. 170-173.

Martin, Steven J., et al., "Development Of A Low Dielectric Constant Polymer For The Fabrication Of Integrated Circuit Interconnect", *12 Advanced Materials*, (Dec. 23, 2000), 1769-1778.

Hadimioglu, B. et al., ""Polymer Films As Acoustic Matching Layers".", *1990 IEEE Ultrasonics Symposium Proceedings*, vol. 3 PP., [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007,(Dec. 1990),1337-1340.

"Search Report from corresponding application No.", GB 0605779. 8, (Aug. 23, 2006).

"Examination Report from UK for application", GB 0605971.1, (Aug. 24, 2006).

"Examination report corresponding to application No.", GB0605770.7, (Aug. 25, 2006).

"Examination Report corresponding to application No.", GB0605775.6, (Aug. 30, 2006).

"Seach report from corresponding application No.", GB0620152.9, (Nov. 15, 2006).

"Search report from corresponding application No.", GB0620655.1, (Nov. 17, 2006).

"Search report from corresponding application No.", GB 0620653.6, (Nov. 17, 2006).

"Search Report from corresponding application No.", GB0620657.7, (Nov. 23, 2006).

Coombs, Clyde F., et al., "Electronic Instrument Handbook", *Second Edition, McGraw-Hill, Inc.*, (1995),pp. 5.1 to 5.29.

"A partial copy of GB Search Report for", Application No. GB0522393.8, (Jan. 9, 2006),4 pages.

"A partial copy of GB Search Report for Application No.", GB0525884.3, (Feb. 2, 2006),4 pgs.

Auld, B. A., "Acoustic Resonators", *Acoustic Fields and Waves in Solids, Second Edition*, vol. II, (1990),250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.* 54 (10), (Oct. 1983),5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britain Patent Application", No. 0619698.4, (Nov. 30, 2006).

Ruby, R. et al., "The Effect of Perimeter Geometry on FBAR Resonator Electrical Performance", *Microwave Symposium Digest, 2005 IEEE MTT-S International*, (Jun. 12, 2005),217-221.

Choi, Sungjin et al., "Design of Half-Bridge Piezo-Transformer Converters in the AC Adapter Applications", *IEEE 2005*, 244-248.

Li, Yunxiu et al., "AC-DC Converter with Worldwide Range Input Voltage by Series and Parallel Piezoelectric Transformer Connection", *35th Annual IEEE Power Electronics Specialists Conference*, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoelectric Transformers", *IEEE*, (2001),492-496.

Jiang, Yimin et al., "A Novel Single-Phase Power Factor Correction Scheme", *IEEE*, (1993),287-292.

Lakin, K.M. et al., "High Performance Stacked Crystal Filters for GPS and Wide Bandwidth Applications", *2001 IEEE Ultrasonics Symposium*, (Jan. 1, 2001),833-838.

Krishnaswamy, S.V. et al., "Film Bulk Acoustic Wave Resonator Technology", (May 29, 1990),529-536.

\* cited by examiner

ACOUSTICALLY COUPLED RESONATORS AND METHOD OF MAKING THE SAME

BACKGROUND

The present invention relates generally to bulk acoustic wave resonators and filters. More particularly, the present invention relates to acoustically coupled thin-film bulk acoustic resonators (FBARS).

Thin-film bulk acoustic resonators (FBARS) are generally fabricated as a piezoelectric layer sandwiched between two electronically conductive layers that serve as electrodes. When electrical signal (for example, radio frequency (RF) signal) is applied to the electrodes, mechanical wave is generated in the piezoelectric layer. Resonance of an FBAR occurs when the wavelength of the mechanical wave generated is approximately twice the thickness of its piezoelectric layer. The resonant frequency of an FBAR (thus, the RF signal exciting the FBAR) can range in the order of hundreds of MHz to many tens of GHz. FBARS are often used to filter electrical signals at these frequencies.

For a typical electrical signal filter application, multiple FBARS are used to form a band-pass filter where electrical signal having frequency within a predetermined and relatively narrow range ("band") of frequencies is allowed to pass while electrical signal having frequency outside the band is blocked or redirected to, for example, ground. These FBARS can be electrically coupled or acoustically coupled to each other. To acoustically couple two FBARS, the FBARS are fabricated vertically with a decoupling layer between the FBARS.

FIG. 1 is a cut-away cross-sectional view of a prior art filter apparatus 100 having two FBAR pairs, each FBAR pair acoustically coupled. The filter 100 includes a first FBAR 110, a second FBAR 120, a third FBAR 130, and a fourth FBAR 140. The first pair includes the first FBAR 110 and the second FBAR 120 acoustically coupled to each other. The second pair includes the third FBAR 130 and the fourth FBAR 140 acoustically coupled to each other.

The first FBAR 110 includes a top electrode 112, a bottom electrode 114, and a portion of a first piezoelectric layer 116 that is sandwiched between the electrodes 112 and 114. The second FBAR 120 includes a portion of a top electrode layer 122 situated under the first FBAR 110, a portion of a bottom electrode layer 124 situated under the first FBAR 110, and a portion of a second piezoelectric layer 126 situated under the first FBAR 110. Lateral boundaries of the second FBAR 120 are defined by the overlaps between the electrode 122 and 124. The first FBAR 110 and the second FBAR 120 are acoustically coupled by a decoupling layer 102.

The fourth FBAR 140 includes a top electrode 142, a bottom electrode 144, and a portion of the first piezoelectric layer 116 that is sandwiched between the electrodes 142 and 144. The third FBAR 130 includes a portion of the top electrode layer 122 situated under the fourth FBAR 140, a portion of the bottom electrode layer 124 situated under the fourth FBAR 140, and a portion of the second piezoelectric layer 126 situated under the fourth FBAR 140. The third FBAR 130 and the fourth FBAR 140 are acoustically coupled by the decoupling layer 102. The second FBAR 120 and the third FBAR are electrically coupled via the common electrode layer.

Input electrical signal is injected to the electrodes 112 and 114 exciting the first FBAR 110 thus generating acoustic signal. The generated acoustic signal is acoustically coupled to the second FBAR 120. The degree of acoustic coupling is determined by the decoupling layer 102, typically implemented as multiple sub-layers. The second FBAR 120 converts the coupled portion of the acoustic signal to electrical signal. The electrical signal is electrically coupled to the third FBAR 130.

The coupled electrical signal excites the third FBAR 130 into generating acoustic signal. The generated acoustic signal is acoustically coupled to the fourth FBAR 140. Again, the degree of acoustic coupling is determined by the decoupling layer 102. The fourth FBAR 140 converts the coupled acoustic signal to electrical signal which is the output electrical signal of the filter 100. The output electrical signal includes only the desired portions (band) of the input electrical signal while undesired portions are blocked, grounded, or both.

Such filter apparatus can be found, for example, in FIG. 3 of U.S. Pat. No. 6,670,866 issued to Ellaet et al. on Dec. 30, 2003 and FIG. 4 of U.S. Pat. No. 6,720,844 issued to Lakin on Apr. 13, 2004.

As illustrated in FIG. 1 and the cited Figures of the cited prior art references, the filter apparatus 100 is often fabricated over an acoustic mirror 104, which, in turn, is fabricated above a surface 105 of a substrate 106. The prior art filter apparatus 100 suffers from a number of shortcoming. For example, as illustrated, the electrodes 112, 114, 142, and 144 (to which input and output signal connections are made) are relatively distal (vertically 109 in FIG. 1) from the top surface 105 of the substrate 106 on which connection pads, for example, a connection pad 108 exists. Reliable connections (connecting the electrodes 112, 114, 142, and 144 to such signal traces) are difficult to fabricate due, in part, to the vertical distance 109 such connections are required to span, and sharp corners 107 that such connection would need to include as illustrated by connector 117.

Accordingly, there remains a need for improved coupled acoustic resonators that overcome these shortcomings.

SUMMARY

The need is met by the present invention. In a first embodiment of the present invention, an apparatus includes a substrate and a two-stage resonator filter fabricated on the substrate. The two-stage resonator filter includes a first stage and a second stage. The first stage includes a first resonator and a second resonator, the second resonator acoustically coupled to the first resonator. The second stage includes a third resonator and a fourth resonator, the fourth resonator acoustically coupled to the third resonator. The second resonator and the third resonators are electrically coupled. A decoupling layer couples the first resonator and the second resonator. The decoupling layer extends between the third resonator and the fourth resonator. The first resonator and the fourth resonator are above the substrate. The decoupling layer is above the first resonator and the fourth resonator. The second resonator and the third resonators are above the decoupling layer.

In a second embodiment of the present invention, a method of manufacturing an apparatus is disclosed. First, a cavity is etched within a substrate, the cavity open to a first major surface of the substrate. The cavity is filled with sacrificial material. A two-stage resonator filter is fabricated above the cavity. Then, the sacrificial material is removed from the cavity.

In a third embodiment of the present invention, single-chip duplexer includes a first two-stage resonator filter and a second two-stage resonator filter. The first two-stage resonator filter is configured to pass electrical signal having a frequency within a first range of frequencies. The first two-stage resonator filter includes an input resonator, an output resonator, and two floating resonators, each resonator including piezoelectric material. The second two-stage resonator filter is configured to pass electrical signal having a frequency within a second range of frequencies. The second two-stage resonator filter includes an input resonator, an output resonator, and two floating resonators, each resonator including piezoelectric material. A lower common piezoelectric layer is shared by the first two-stage resonator filter and by the second two-stage resonator filter. An upper common piezoelectric layer is shared by the first two-stage resonator filter and by the second first two-stage resonator filter.

In a fourth embodiment of the present invention, an apparatus includes a two-stage resonator filter connected to two input signal lines and two output signal lines. The two-stage resonator filter includes a first stage including a first resonator and a second resonator, the second resonator acoustically coupled to the first resonator; and a second stage including a third resonator and a fourth resonator, the fourth resonator acoustically coupled to the third resonator. A decoupling layer between the first resonator and the second resonator, the decoupling layer extending between the third resonator and the fourth resonator. The apparatus further includes at least one of the following a shunt resonator across the input signal lines; a shunt resonator across the output signal lines; a series resonator along its input signal lines; and a series resonator along its output signal lines.

In a fifth embodiment of the present invention, an apparatus includes a two-stage resonator filter connected to an input signal line and an output signal line. The two-stage resonator filter includes a first stage including a first resonator and a second resonator; the second resonator acoustically coupled to the first resonator; and a second stage including a third resonator and a fourth resonator, the fourth resonator acoustically coupled to the third resonator. A decoupling layer is between the first resonator and the second resonator, the decoupling layer extending between the third resonator and the fourth resonator. The apparatus further includes a first bridge capacitor bridging the input signal line and the second resonator and a second bridge capacitor bridging the output signal line and the third resonator.

In a sixth embodiment of the present invention, an apparatus includes a first two-stage resonator filter and a second two-stage resonator filter. The first two-stage resonator filter is connected to an input signal line and a first output signal line. The first two-stage resonator filter includes a first stage including a first resonator and a second resonator, the second resonator acoustically coupled to the first resonator; and a second stage including a third resonator and a fourth resonator, the fourth resonator acoustically coupled to the third resonator. A decoupling layer is between the first resonator and the second resonator, the decoupling layer extending between the third resonator and the fourth resonator. The second two-stage resonator filter includes a first stage including a first resonator and a second resonator, the second resonator acoustically coupled to the first resonator; and a second stage including a third resonator and a fourth resonator, the fourth resonator acoustically coupled to the third resonator. A decoupling layer is between the first resonator and the second resonator, the decoupling layer extending between the third resonator and the fourth resonator. Both the first two-stage resonator and the second two-stage resonator are connected to the same input signal line.

Other aspects and advantages of the present invention will become apparent from the following detailed description, taken in conjunction with the accompanying drawings, illustrating by way of example the principles of the invention.

DETAILED DESCRIPTION

The present invention will now be described with reference to the Figures which illustrate various embodiments of the present invention. In the Figures, some sizes of structures or portions may be exaggerated and not to scale relative to sizes of other structures or portions for illustrative purposes and, thus, are provided to illustrate the general structures of the present invention. Furthermore, various aspects of the present invention are described with reference to a structure or a portion positioned "on" or "above" relative to other structures, portions, or both. Relative terms and phrases such as, for example, "on" or "above" are used herein to describe one structure's or portion's relationship to another structure or portion as illustrated in the Figures. It will be understood that such relative terms are intended to encompass different orientations of the device in addition to the orientation depicted in the Figures.

For example, if the device in the Figures is turned over, rotated, or both, the structure or the portion described as "on" or "above" other structures or portions would now be oriented "below," "under," "left of," "right of," "in front of," or "behind" the other structures or portions. References to a structure or a portion being formed "on" or "above" another structure or portion contemplate that additional structures or portions may intervene. References to a structure or a portion being formed on or above another structure or portion without an intervening structure or portion are described herein as being formed "directly on" or "directly above" the other structure or the other portion. Same reference number refers to the same elements throughout this document.

Overview

Figure 1:
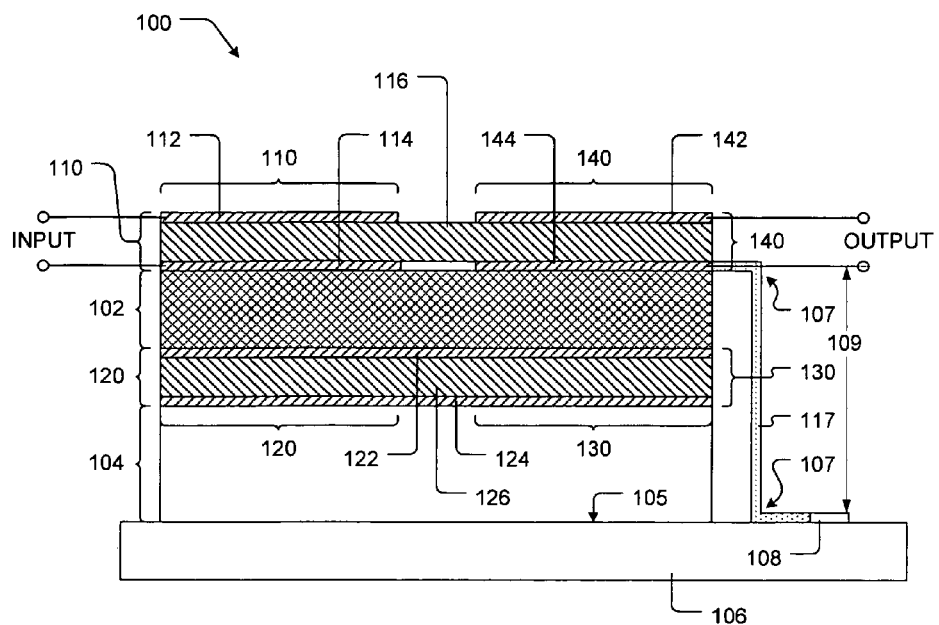
FIG. 1 is a cut-away cross-sectional view of a known two-stage resonator filter.
Figure 2A:
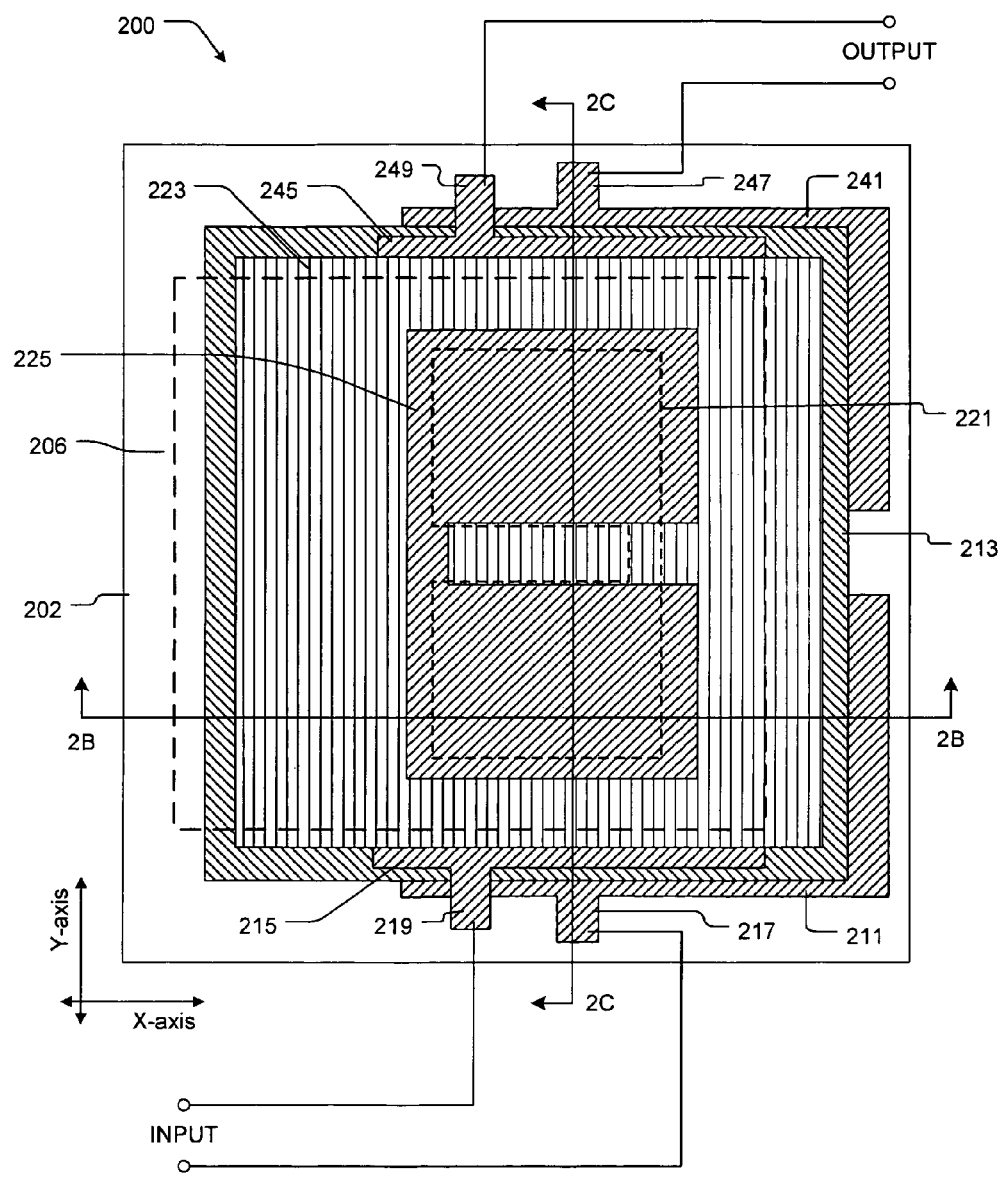
FIG. 2A is a top view of a two-stage resonator filter according to a first embodiment of the present invention.
Figure 2B:
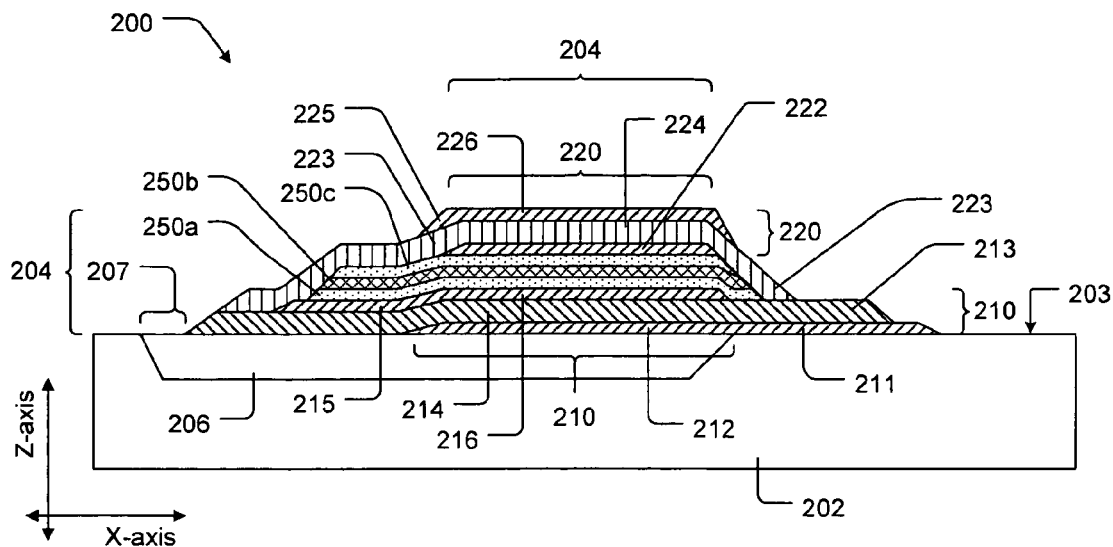
FIG. 2B is a cut-away cross-sectional view of the two-stage resonator filter of FIG. 2A cut along line 2B-2B.
Figure 2C:
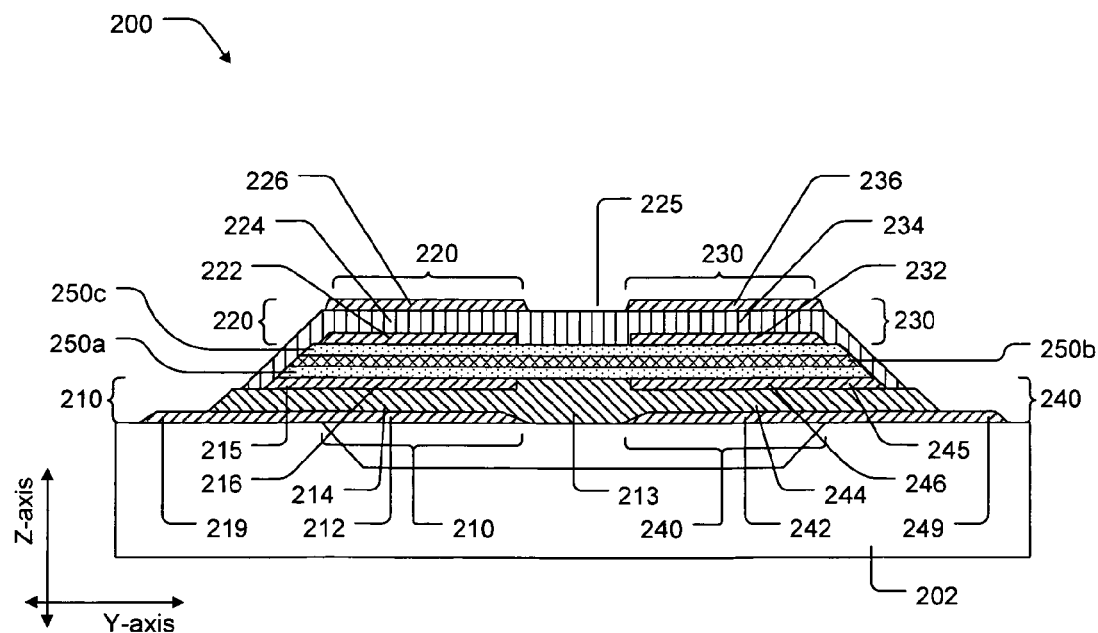
FIG. 2C is a cut-away cross-sectional view of the two-stage resonator filter of FIG. 2A cut along line 2C-2C.

FIGS. 2A through 2C illustrate an apparatus 200 including a two-stage resonator filter 204 in accordance with one embodiment of the present invention, two-stage resonator filter 204 fabricated over a cavity 206 within its substrate 202. The two-stage resonator filter 204 includes acoustically coupled resonators. The cavity 206 eliminates the need for the acoustic mirror 104 of the prior art filter 100 of FIG. 1. Further, here, an input resonator 210 and an output resonator 240 are fabricated relatively proximal to the substrate 202 while floating resonators 220 and 230 are fabricated relatively distal to the substrate 202. Accordingly, necessity of connectors to connection pads (such as the connector 117 of the apparatus 100 of FIG. 1) is eliminated or minimized.

FIG. 2A is a top view of an apparatus 200 in accordance with one embodiment of the present invention. FIG. 2B is a cutaway side view of the apparatus 200 cut along line 2B-2B. FIG. 2C is a cutaway side view of the apparatus 200 cut along line 2C-2C. Referring to FIGS. 2A, 2B, and 2C, the apparatus 200 includes a substrate 202 and a two-stage resonator filter 204, for example a double mode two-stage resonator filter (DMF) 204, fabricated on the substrate 202.

The two-stage resonator filter 204 and each of its component resonators can be configured in a wide range of shapes and sizes. Often, the resonator of the two-stage resonator filter 204 has an irregular shape to minimize parasitic resonance and harmonics. Here, for convenience, the two-stage resonator filter 204 is illustrated having generally rectangular shape. Dimension of the two-stage resonator filter 204 and each of its resonators can vary widely depending on application and desired characteristics such as desired frequency band and packaging requirements. For example, in the illustrated embodiment, the two-stage resonator filter 204 can have lateral dimensions (in X-Y axes) in the order of hundreds of micrometers and thickness (in Z-axis) in the order of several micrometers or more while each of the resonators of the two-stage resonator filter can have lateral dimensions (in X-Y axes) in the order of hundreds of micrometers and thickness (in Z-axis) in the order of several micrometers. Again, the dimensions can vary widely, even outside these ranges.

The two-stage resonator filter 204 includes a first resonator 210 (also referred to as the input resonator 210), a second resonator 220, a third resonator 230, and a fourth resonator 240 (also referred to as the output resonator 240). Each of the resonators (210, 220, 230, and 240) is, in the illustrated embodiment, a thin-film bulk acoustic resonator (FBAR); however, the present embodiment may be implemented using other types of electro-acoustic resonators. Each of the resonators (210, 220, 230, and 240) includes a bottom electrode and a top electrode sandwiching piezoelectric material between the two electrodes. The two-stage resonator filter 204 is fabricated over a cavity 206 etched within the substrate 202.

The apparatus 200 includes a first bottom electrode layer 211 fabricated on the substrate 202. Portions of the first bottom electrode layer 211 overhang the cavity 206 while other portions do not. The apparatus 200 includes a second bottom electrode layer 241 fabricated on the substrate 202. Portions of the second bottom electrode layer 241 overhang the cavity 206 while other portions do not. The bottom electrode layers 211 and 241 include electrically conductive material such as, for example only Molybdenum. The bottom electrode layers 211 and 241 have thickness (in Z-axis) in the order of tenths of micrometers, for example, 0.21 micrometers. The thickness of the electrode depends on a number of factors such as, for example, frequency and desired characteristics of the two-stage resonator filter 204. For a DCS (digital cellular system operating frequencies around 1.8 GHz) filter, the typical thickness is about 0.21 micrometer.

The apparatus 200 includes a lower piezoelectric layer 213 fabricated over the first bottom electrode layer 211 and the second bottom electrode layer 241. The apparatus 200 includes a first top electrode layer 215 fabricated on the lower piezoelectric layer 213. The piezoelectric layer 213 includes piezoelectric material such as, for example only, Aluminum Nitride (AlN). The piezoelectric layer 213 has thickness (in Z-axis) in the order of micrometers in the illustrated sample embodiment, for example, approximately 1.7 micrometers

First Resonator

The first resonator 210 includes a bottom electrode 212, a top electrode 216, and piezoelectric material 214 sandwiched between the bottom electrode 212 and the top electrode 216. The bottom electrode 212 is the portion of the bottom electrode layer 211 that overhangs the cavity 206 and also overlaps with the top electrode 216. The top electrode 216 is the portion of the first top electrode layer 215 that overhangs the cavity 206 and also overlaps the bottom electrode 212. The piezoelectric material 214 is a portion of the lower piezoelectric layer 213 that is between the bottom electrode 212 and the top electrode 216.

Fourth Resonator

The apparatus 200 includes a second top electrode layer 245 fabricated on the lower piezoelectric layer 213. The fourth resonator 240 includes a bottom electrode 242, a top electrode 246, and piezoelectric material 244 sandwiched between the bottom electrode 242 and the top electrode 246. The bottom electrode 242 is the portion of the bottom electrode layer 241 that overhangs the cavity 206 and also overlaps the top electrode 246. The top electrode 246 is the portion of the second electrode layer 245 that overhangs the cavity 206 and also overlaps the bottom electrode 242. The piezoelectric material 244 is a portion of the lower piezoelectric layer 213 that is between the bottom electrode 242 and the top electrode 246.

Decoupling Layer

The apparatus 200 includes a decoupling layer 250 fabricated over the top electrode layers 215 and 245. The decoupling layer 250 is provided between the first resonator 210 and the second resonator 220. The decoupling layer 250 extending between the third resonator 230 and the fourth resonator 240 as illustrated in FIGS. 2A through 2C and further discussed below. In the illustrated embodiment, the decoupling layer 250 is illustrated including sub-layers 250a, 250b, and 250c.

The decoupling layer 250 can be a single layer or can consist of mirrors, each mirror including two layers (a pair of) of materials with different acoustical impedance. If the decoupling layer 250 is implemented including mirrors, then the decoupling layer 250 is often implemented using an odd number of layers such that the decoupling layer 250 is symmetrical to resonators to either side of the decoupling layer 250. For example, the decoupling layer 250 can be have the following structures: a low-impedance layer (L) 250a—high-impedance layer (H) 250b—low-impedance layer (L) 250c (LHL); LHLHL; etc.

Referring again to FIGS. 2A through 2C, thickness (in the z-axis direction) of each sub-layer in the mirror of the decoupling layer 250, in the illustrated embodiment, is approximately one quarter of wavelength of the desired acoustic signal to be coupled by the decoupling layer 250. The thickness can vary depending on a number of factors and desired characteristics such as, for example, the material of the mirrors, the number of mirrors, desired coupling strength, etc. Acoustic coupling efficiency, the degree of coupling of acoustic signal, from the first resonator 210 to the second resonator 220 depends on a number of factors, for example, material properties of each layer of the decoupling layer 250; number of mirrors in the decoupling layer 250; thickness of each layer of the decoupling layer 250.

Materials for the mirror pairs can include, for example only, the following material pairs:

Silicon Dioxide (SiO2) and Tungsten (W);
SiO2 and Molybdenum (Mo);
SiO2 and Aluminum Nitride (AlN);
Si3N4 (silicon nitride) and Mo;
Si3N4 and W;
amorphous Silicon (Si) and Mo;
amorphous Si and W;
AlN and W; or
AlN and Mo.

A simple coupling structure can be three layers such as SiO2/W/SiO2 if the impedance difference between the low and high impedance material is large. When such simple structure is used, the thickness of each layer needs to be adjusted for required bandwidth of the filter designed. Some typical numbers for a WCDMA filter application, the coupling structure could have, in the illustrated embodiment, thicknesses of SiO2 sub-layer (4800 Angstroms), W sub-layer (5200 Angstroms), and SiO2 sub-layer (4800 Angstroms).

For some applications, SiO2 is a desirable material in the decoupling layer 250 because of its properties such as, for example, low acoustical impedance, commonly available in integrated circuit (IC) fabrication process, comprehensive stress (useful for compensating tensile stress associated with most of materials with high acoustical impedance), and positive temperature coefficient (useful for compensating negative temperature coefficient of FBAR resonators).

However, in the present invention, SiO2 is often used as temporary sacrificial material during the fabrication of the cavity 206. That is, during the fabrication process, SiO2 is used to first fill the cavity, then the filler SiO2 is removed using hydrofluoric acid bath. It would be undesirable for the SiO2 layers of the decoupling layer 250 during the step to remove the SiO2 in the cavity. This problem is overcome in various method discussed herein below.

Second Resonator

The apparatus 200 includes a third bottom electrode layer 221 fabricated over the decoupling layer 250, an upper piezoelectric layer 223 fabricated over the third bottom electrode layer 221, and a third top electrode layer 225 fabricated over the upper piezoelectric layer 223. The third bottom electrode layer 221 is hidden behind other portions and is illustrated using dashed line in FIG. 2A.

The second resonator 220 includes a bottom electrode 222, a top electrode 226, piezoelectric material 224 sandwiched between the bottom electrode 222 and the top electrode 226. The bottom electrode 222 is the portion of the bottom electrode layer 221 that is situated over the first resonator 210 and overlaps the top electrode 226. The top electrode 226 is the portion of the top electrode layer 225 that is situated over the first resonator 210 and overlaps the bottom electrode 222. The piezoelectric material 224 is a portion of the upper piezoelectric layer 223 that is between the bottom electrode 222 and the top electrode 226. The lateral dimensions of the second resonator 220 are determined by the overlaps between bottom electrode 222 and top electrode 226.

Third Resonator

The third resonator 230 includes a bottom electrode 232, a top electrode 236, piezoelectric material 234 sandwiched between the bottom electrode 232 and the top electrode 236. The bottom electrode 232 is the portion of the bottom electrode layer 221 that is situated over the fourth resonator 240 and overlaps the top electrode 236. The top electrode 236 is the portion of the top electrode layer 225 that is situated over the fourth resonator 240 and overlaps the bottom electrode 232. The piezoelectric material 234 is a portion of the upper piezoelectric layer 223 that is between the bottom electrode 232 and the top electrode 236. (The lateral dimensions of the third resonator 230 are determined by the overlaps between bottom electrode 232 and top electrode 236.

First and Second Stages and the Four Resonators

The first resonator 210 and the second resonator 220 are acoustically coupled via a portion of the decoupling layer 250. The first resonator 210 and the second resonator 220 make up a first stage of the two-stage resonator filter 204.

The third resonator 230 and the fourth resonator 240 are acoustically coupled via another portion of the decoupling layer 250. The third resonator 230 and the fourth resonator 240 make up a second stage of the two-stage resonator filter 204.

The second resonator 220 and the third resonator 230 are electrically coupled. This is because the bottom electrode 222 of the second resonator 220 and the bottom electrode 232 of the third resonator 230 are portions of the same third electrode layer 221. Further, this is also because the top electrode 226 of the second resonator 220 and the top electrode 236 of the third resonator 230 are portions of the same third top electrode layer 225.

Each of the four resonators 210, 220, 230, and 240 making up the two-stage resonator filter 204 can be configured in a wide range of shapes and sizes. Often, these resonators have irregular shapes to minimize parasitic resonance and harmonics. Here, for convenience, each of these resonators is illustrated having a generally rectangular shape. Dimension of these resonators can vary widely depending on application and desired characteristics as already discussed above with sample dimensions.

Input Signal and Output Signal Connections

A portion 217 of the first bottom electrode layer 211 is left exposed (that is, not covered by subsequently fabricated layers) to serve as a connection pad 217 for input signal. A portion 247 of the second bottom electrode layer 241 is left exposed (that is, not covered by subsequently fabricated layers) to serve as a connection pad 247 for output signal.

A portion 219 of the first top electrode layer 215 is left exposed (that is, not covered by subsequently fabricated layers) to serve as a connection pad 219 for input signal. A portion 249 of the second top electrode layer 245 is left exposed (that is, not covered by subsequently fabricated layers) to serve as a connection pad 249 for output signal. Here, input electrical signal is applied to input connection pads 217 and 219, and output electrical signal is extracted via the output connection pads 247 and 249.

Because the input signal is applied to the first resonator 210, the first resonator 210 is also referred to as the input resonator. Moreover, because the output signal is drawn from the fourth resonator 240, the fourth resonator 240 is also referred to as the output resonator. The second resonator 220 and the third resonator 230 are said to "float" above the first resonator 210 and the fourth resonator 240. For this reason, the second resonator 220 and the third resonator 230 are also referred to as floating resonators.

Operation

Input electrical signal is injected to the electrodes 212 and 216 exciting the input resonator 210 causing input resonator 210 to vibrate thus generating acoustic signal. The generated acoustic signal is acoustically coupled to the second resonator 220. The degree of acoustic coupling is determined by the decoupling layer 250 as discussed above. The second resonator 220 converts the coupled portion of the acoustic signal to electrical signal. The electrical signal is electrically coupled to the third resonator 230 with which the second resonator shares the third bottom electrode layer 221 and the third top electrode layer 225.

The coupled electrical signal excites the third resonator 230 into generating acoustic signal. The generated acoustic signal is acoustically coupled to the fourth resonator 240. Again, the degree of acoustic coupling is determined by the decoupling layer 250. The fourth resonator 240 converts the coupled acoustic signal to electrical signal which is the output electrical signal of the two-stage resonator filter 204. The output electrical signal includes only the desired portions (band) of the input electrical signal while undesired portions are routed to ground (connection not illustrated in the Figures).

Cavity

In the illustrated embodiment of the present invention, the cavity 206 provides for separation of the two-stage resonator filter 204 from the substrate 202 thereby allowing the two-stage resonator filter 204 to vibrate freely. The cavity 206 can be configured in a wide range of shapes and sizes. For convenience, the cavity 206 is illustrated having a generally rectangular shape. Dimension of the cavity 206 can vary widely depending on application and desired characteristics. For example, in the illustrated embodiment, the cavity 206 has lateral dimensions (in X-Y axes) in the order of hundreds of micrometers and depth (in Z-axis) in the order of several micrometers or more.

Advantages

Continuing to refer to FIGS. 2A through 2C, the apparatus 200 of the present invention does not require the acoustic mirror 104 (as used by the apparatus 100 of FIG. 1). For this reason, the two-stage resonator filter 204 is fabricated directly on the substrate 202. Further, here, input resonator 210 and the output resonator 240 are fabricated relatively proximal to the substrate 202 while floating resonators 220 and 230 are fabricated relatively distal to the substrate 202. Accordingly, necessity of connectors to connection pads (such as the connector 117 of the apparatus 100 of FIG. 1) is eliminated or minimized.

Method 1

Figure 3:
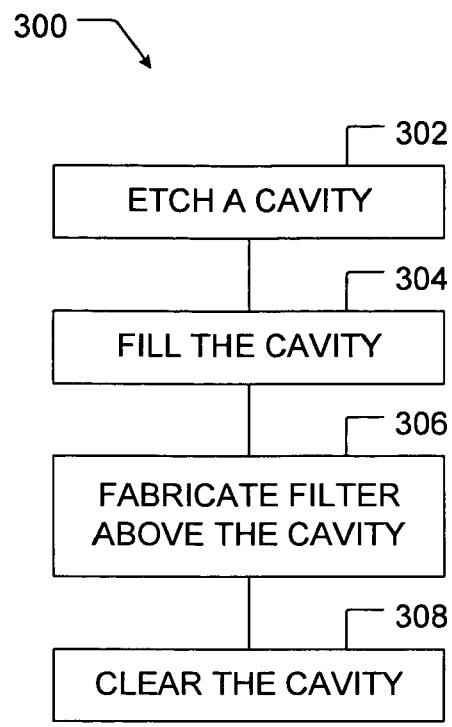
FIG. 3 is a flowchart illustrating a second embodiment of the present invention.

FIG. 3 is a flowchart 300 illustrating a method of fabricating an apparatus according to another embodiment of the present invention. The apparatus fabricated being an apparatus such as, for example, the apparatus 200 of FIGS. 2A through 2C. Referring to FIGS. 2A through 2C and FIG. 3, first, the cavity 206 is etched. The cavity 206 is open to a first major surface 203 of the substrate 202. Step 302. The cavity is filled with some sacrificial material such as, for example only, SiO2, Aluminum (Al), Germanium (Ge), amorphous Silicon (amorphous-Si), porous Silicon (porous-Si), or phosphorus silicate glass (PSG). Step 304. Then, the two-stage resonator filter 204 is fabricated over the cavity leaving an access gap 207 for evacuation of the sacrificial material. Step 306. To fabricated each layer of the two-stage resonator filter 204, known deposit and etch techniques can be used. Finally, the sacrificial material is removed from the cavity 206 thereby clearing the cavity 206. Step 308. This step is often performed by introducing the apparatus 200 into an acid bath.

If the same material (for example, SiO2) is used for the sacrificial material as well as for at least one of the sub-layers of the decoupling layer 250, the decoupling layer 250 can be protected (during the step 308 to remove the sacrificial material) by other layers of the two-stage resonator filter 204. One embodiment of this technique is illustrated in FIGS. 2A through 2C where the lower piezoelectric layer 213 and the upper piezoelectric layer 223 envelope and enclose the decoupling layer 250 thereby protecting the decoupling layer 250 from the acid bath which removes the sacrificial material from the cavity 206.

If the sacrificial material is different than the materials used for the sub-layers of the decoupling layer 250, then there may not a need for the decoupling layer 250 to be enveloped or protected during step 308 to remove the sacrificial material from the cavity 206. In such a case, the decoupling layer 250 need not be enveloped or protected by other layers.

Method 2

In the method outlined in FIG. 3, piezoelectric layers can be used to protect the decoupling layer 250 from damage during the step 308 of clearing the cavity 206 should the decoupling layer 250 include same or similar material as the sacrificial material used for the cavity 206.

Figure 5:
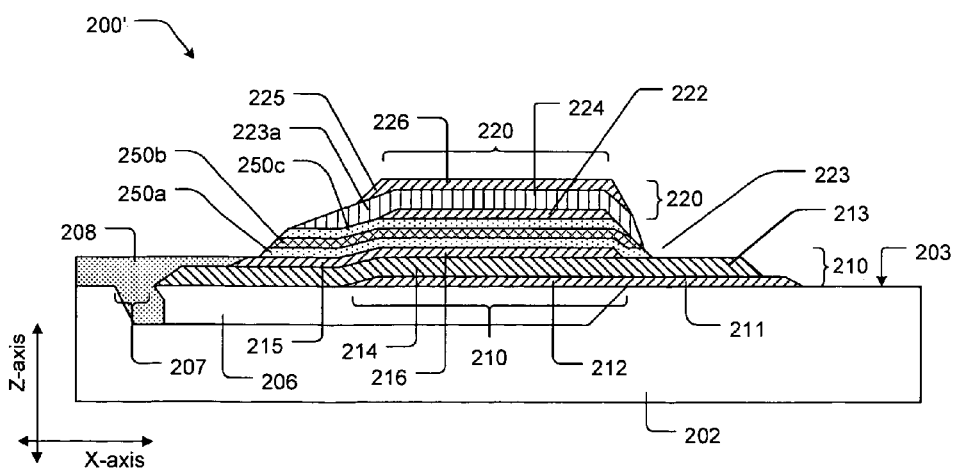
FIG. 5 is a cut-away cross sectional view of a partially fabricated apparatus of FIGS. 2A through 2C
Figure 4:
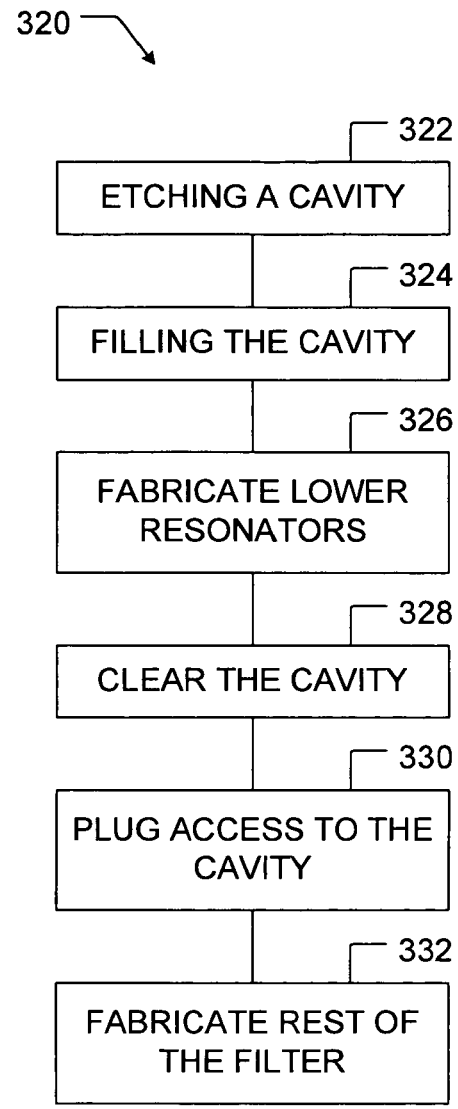
FIG. 4 is a flowchart illustrating a third embodiment of the present invention.

To protect the decoupling layer 250 during the step of clearing the cavity 206, an alternative technique (alternative to enveloping the decoupling layer 250 using other layers) is illustrated by a flowchart 320 of FIG. 4 and by an apparatus 200a of FIG. 5. FIG. 5 illustrates a cut-away side view of the apparatus 200a. The apparatus 200a has similar structure as the apparatus 200 of FIGS. 2A through 2C. Further, portions of the apparatus 200a of FIG. 5 are similar to corresponding portions of the apparatus 200 of FIGS. 2A through 2C. For convenience, portions in FIG. 5 that are similar to corresponding portions in FIGS. 2A through 2C are assigned the same reference numerals, analogous but changed portions are assigned the same reference numerals accompanied by letter "a."

Referring to FIGS. 4 and 5, first, the cavity 206 is etched. Step 322. The cavity 206 is open to a first major surface 203 of the substrate 202. The cavity is filled with some sacrificial material such as, for example only, SiO2, Aluminum (Al), Germanium (Ge), amorphous Silicon (amorphous-Si), porous Silicon (porous-Si), or phosphorus silicate glass (PSG). Step 324.

Next, the first resonator 210 and a fourth resonator (collectively, "lower resonators", the fourth resonator is hidden behind the illustrated portions in FIG. 5) are fabricated in the same manner as the first resonator 210 and the fourth resonator 240 of the apparatus 200 of FIGS. 2A through 2C. Step 326. The sacrificial material is removed from the cavity 206 thereby clearing the cavity 206. Step 328. Then, the access gap 207 is plugged whereby access to the cavity 206 is closed. Step 330. A plug 208 can be fabricated using dielectric materials such as polyamide which is spun on and patterned with photolithograph process.

Next, the rest of the elements of the apparatus 200a are fabricated including the decoupling layer 250 and upper resonators (the second resonator 220 and the third resonator hidden behind the illustrated portions in FIG. 5). Step 232. To fabricated the rest of the elements of the two-stage resonator filter 204, known deposit and etch techniques can be used.

In this method, since the cavity 206 is cleared before fabrication of the decoupling layer 250, the decoupling layer 250 need not be exposed to the chemicals used to clear the cavity 206. Hence, same or similar materials can be used for the decoupling layer 250 and as the sacrificial material. Further, the upper piezoelectric layer 223a here need not envelope the decoupling layer 250.

Duplex Implementation

Multiple two-stage resonator filters of the present invention can be combined for various useful circuits. For example, another embodiment of the present invention is illustrated in FIG. 6 as a single-chip duplexer 400 including a substrate 402 and a first two-stage resonator filter 404 and a second two-stage resonator filter 454 on the substrate 402.

Figure 6:
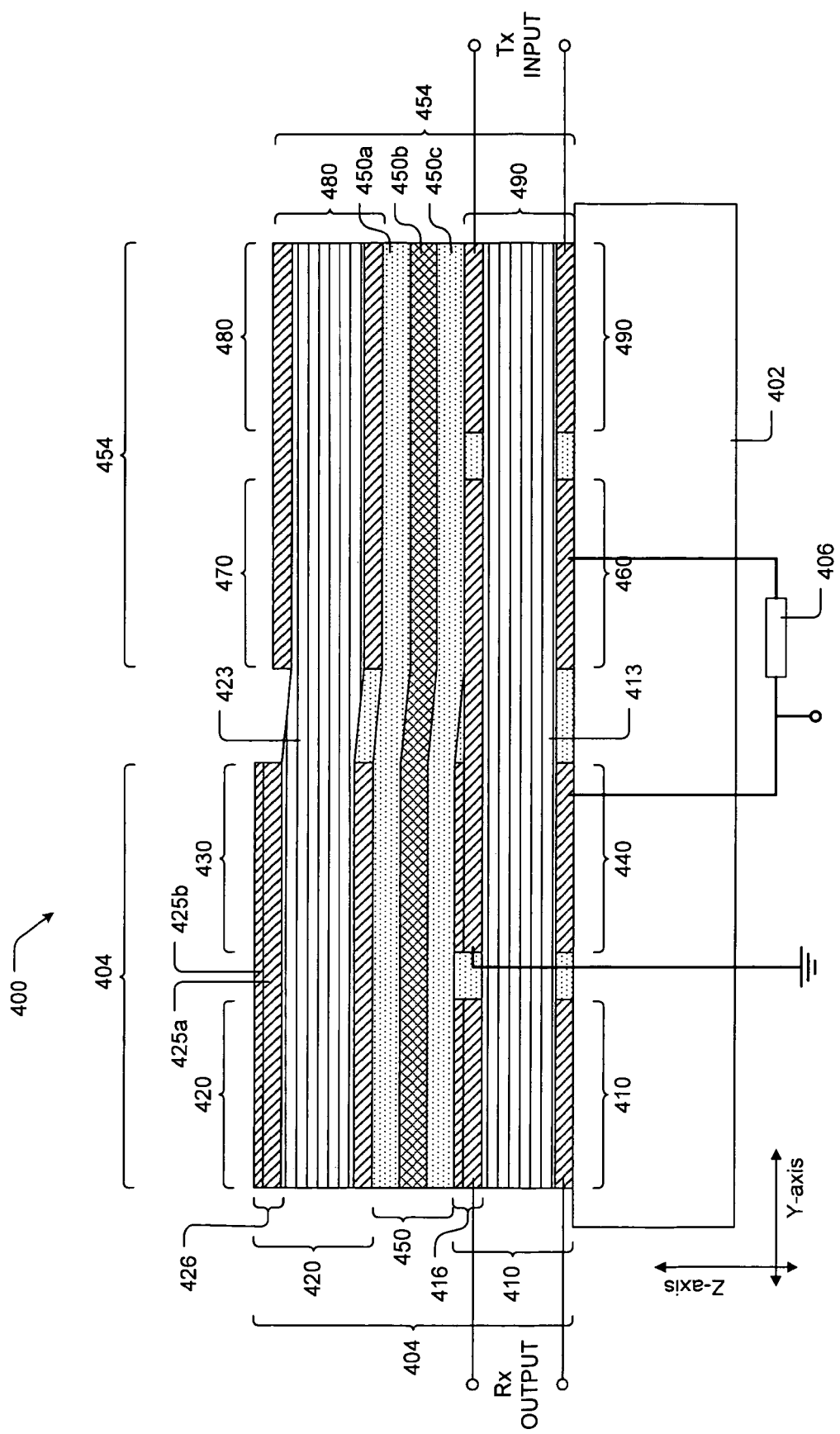
FIG. 6 is a cut-away cross-sectional view of another apparatus illustrating a fourth embodiment of the present invention.

Referring to FIG. 6, the first two-stage resonator filter 404 and the second two-stage resonator filter 454 have similar structure as and operates under similar principles to the two-stage resonator filter 204 of FIGS. 2A through 2C. For example, the first two-stage resonator filter 404 includes its input resonator 410 and output resonator 440 relatively proximal to the substrate 402. A decoupling layer 450 is above the input resonator 410 and the output resonator 440. And, floating resonators (a second resonator 420 and a third resonator 430) are above the decoupling layer 450. Each of these resonators 410, 420, 430, and 440 include piezoelectric material as illustrated.

The second two-stage resonator filter 454 includes its input resonator 460 and output resonator 490 relatively proximal to the substrate 402. The decoupling layer 450 is above the input resonator 460 and the output resonator 490. And, floating resonators (a second resonator 470 and a third resonator 480) are above the decoupling layer 450. Each of these resonators 460, 470, 480, and 490 include piezoelectric material as illustrated.

Since the single-chip duplexer 400 includes two two-stage resonator filters 404 and 454 on the same chip, the first two-stage resonator filter 404 and the second two-stage resonator filter 454 share a lower common piezoelectric layer 413 and share an upper common piezoelectric layer 423. That is, different portions of the contiguous lower common piezoelectric layer 413 are used within the first two-stage resonator filter 404 to constitute its resonators and are used within the second two-stage resonator filter 454 to constitute its resonators. Likewise, different portions of the contiguous upper common piezoelectric layer 423 are used within the first two-stage resonator filter 404 to constitute its resonators and are used within the second two-stage resonator filter 454 to constitute its resonators.

Further, the first two-stage resonator filter 404 and the second two-stage resonator filter 454 share the decoupling layer 450. That is, different portions of the decoupling layer 450 are used within the first two-stage resonator filter 404 and are used within the second two-stage resonator filter 454.

As already discussed two-stage resonator filters are often implemented as a band-pass filter where electrical signal having frequency within a predetermined and relatively narrow range ("band") of frequencies is allowed to pass while electrical signal having frequency outside the band is blocked.

Figure 7:
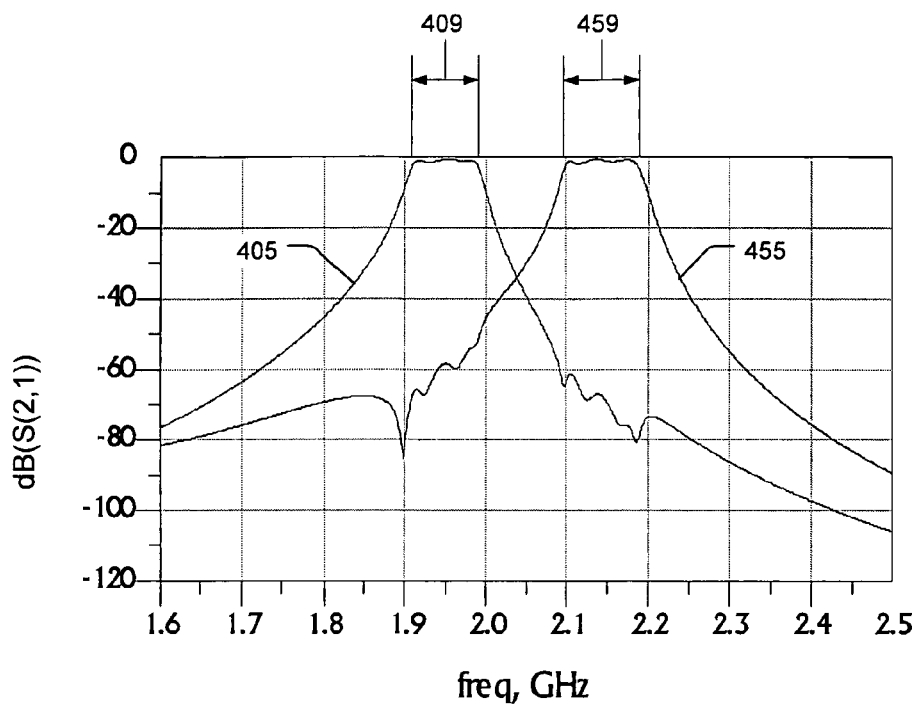
FIG. 7 is a band-pass characteristic curve of the apparatus of FIG. 6.

FIG. 7 illustrates the band-pass characteristics of the single-chip duplexer 400. Referring to FIGS. 6 and 7, the first two-stage resonator filter 404 is configured to pass electrical signal having a frequency within a first pass band range 409 of frequencies (as illustrated by first band-pass characteristic curve 405) while the second two-stage resonator filter 454 is configured to pass electrical signal having a frequency within a second pass band range 459 of frequencies (as illustrated by second band-pass characteristic curve 455). The band-pass characteristic curves 405 and 455 and similar graph curves are often referred to as pass band curves because they illustrate bands of frequencies passed by the two-stage resonator filters 404 and 454.

Input and output signals of the single-chip duplexer 400 are further processed by other circuits such as, for example only, a phase shifter 406. The phase shifter 406 can be used to isolate the two-stage resonator filters 404 and 454 from each other to reduce influence of one of the two-stage resonator filters 404 and 454 on the other two-stage resonator filter as the single-chip duplexer 400 operates with external circuits such as, for example, an antenna.

The difference in the band-pass ranges 409 and 459 is achieved by mass loading the resonators of the first two-stage resonator filter 404 such that the resonators of the first two-stage resonator filter 404 has a different resonant frequency compared to the resonators of the second two-stage resonator filter 454. Here, as an example only, mass is added to top electrodes 416 and 426 of the resonators of the first two-stage resonator filter 404 increasing the thickness (in the Z-axis) of the resonators thereby increasing the wavelength of the resonant frequency of these resonators. Increased resonant wavelength translates into lower resonant frequency.

Applications of Two-Stage Resonator Filters

The two-stage resonator filter 204 illustrated in FIGS. 2A through 2C has band-pass characteristic having similar shape as the band-pass characteristic curves 405 and 455 in FIG. 7. Band-pass characteristics having different characteristics, for example, sharper roll-off can be achieved using the two-stage resonator filter 204 in combination of other circuit elements.

Figure 8A:
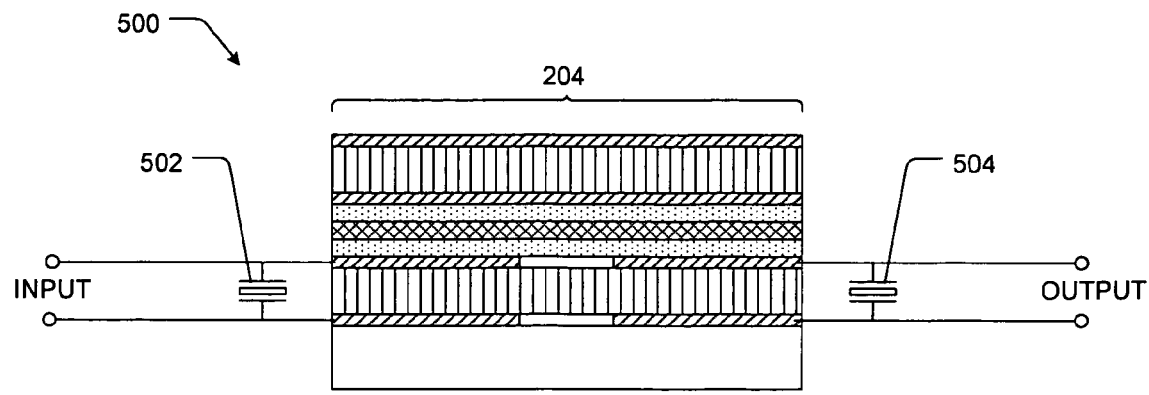
FIG. 8A is an apparatus in accordance with fifth embodiment of the present invention.
Figure 8B:
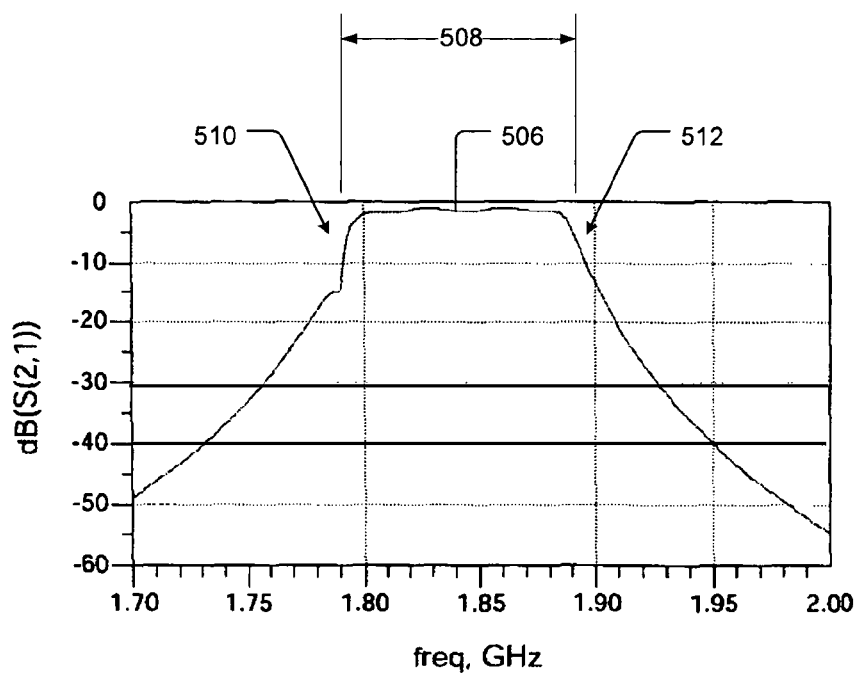
FIG. 8B is a band-pass characteristic curve of the apparatus of FIG. 8A.

FIG. 8A illustrates a filter apparatus 500 including a two-stage resonator filter 204 with a first shunt thin-film baulk acoustic resonator (FBAR) 502 in the input side of the two-stage resonator filter 204 and a second shunt thin-film baulk acoustic resonator (FBAR) 504 in the output side of the two-stage resonator filter 204. Referring to FIG. 8A, the filter apparatus 500, with the shunt resonators 502 and 504, has band-pass characteristic as illustrated by band-pass characteristic curve 506 of FIG. 8B having a band-pass range 508 ranging from approximately 1.79 GHz (lower end of the frequency range) to 1.89 GHz (upper end of the frequency range). In the present example, the shunt resonators 502 and 504 are tuned to near 1.79 GHz, at the lower end 510 of the band-pass range 508 compared to, for example, at the upper end 512 of the band-pass range 508. Here, the upper end 512 of the band-pass range 508 has relatively gradual roll-off.

If a sharper roll-off is desired for the upper end 512 of the band-pass range 508, serial resonators can be added to the input and output lines. This is illustrated as a filter apparatus 520 of FIG. 9. The filter apparatus 520 of FIG. 9 includes portions similar to corresponding portions of filter apparatus 500 of FIG. 8A. Portions of filter apparatus 520 of FIG. 9 that are similar to corresponding portions of filter apparatus 500 of FIG. 8A are assigned the same reference numerals.

Figure 9:
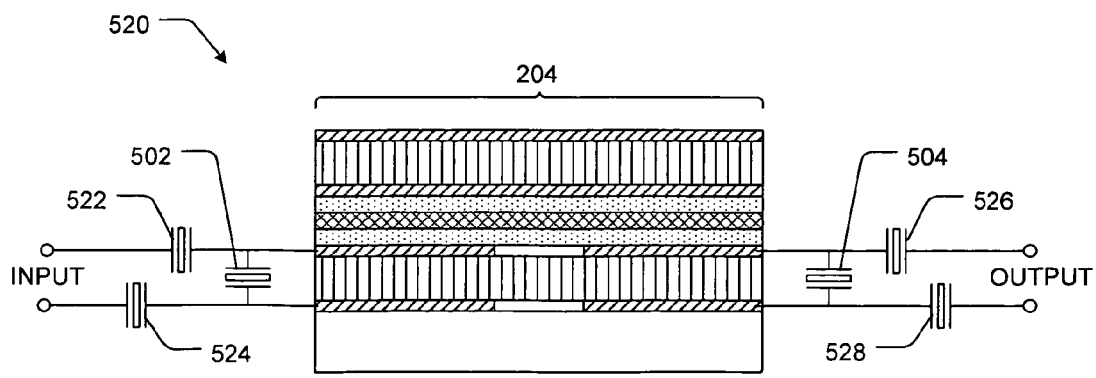
FIG. 9 is an apparatus in accordance with sixth embodiment of the present invention.

Referring to FIG. 9, the filter apparatus 520 includes all the portions of the filter apparatus 500 of FIG. 8A. In addition, the filter apparatus 520 includes series resonators, for example FBARs, 522 and 524 in its input lines and series resonators, for example FBARs, 526 and 528 in its output lines. The series resonators 522, 524, 526, and 528 are tuned to tuned to near 1.89 GHz, at the upper end 512 of the band-pass range 508 resulting in a sharper roll-off of the band-pass characteristic curve 506 at the at the upper end 512 of the band-pass range 508. The sharper roll-off is not illustrated.

Figure 10A:
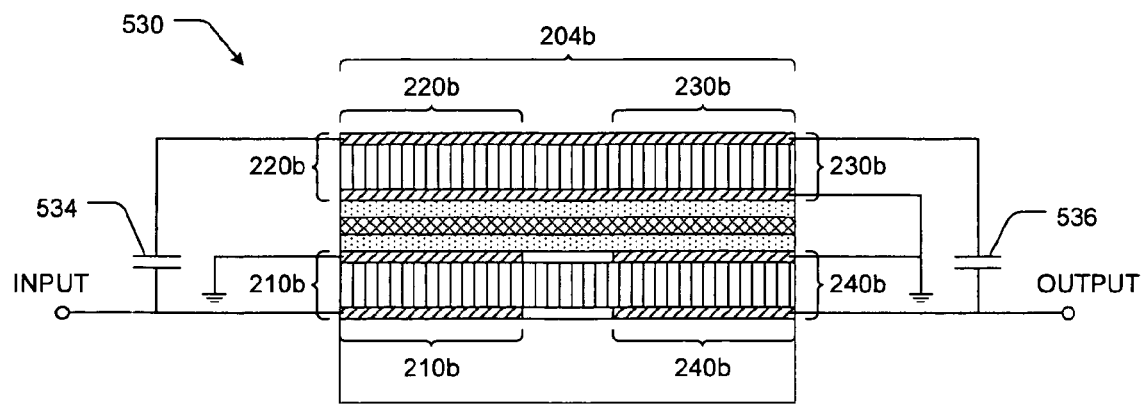
FIG. 10A is an apparatus in accordance with seventh embodiment of the present invention.

FIG. 10A illustrates an alternative technique for adjusting the band-pass characteristics of a two-stage resonator filter. Referring to FIG. 10A, a filter apparatus 530 includes a two-stage resonator filter 204b that is similar to the two-stage resonator filter 204 of FIGS. 2A through 2C but tuned to have a band-pass frequency range ranging from approximately 820 MHz to 850 MHz as illustrated by band-pass characteristic curve 532 of FIG. 10B. The two-stage resonator filter 204b has similar structure as the two-stage resonator filter 204 of FIGS. 2A through 2C. Further, portions of the two-stage resonator filter 204b of FIG. 10A are similar to corresponding portions of the two-stage resonator filter 204b of FIGS. 2A through 2C. For convenience, portions in FIG. 10A that are similar to corresponding portions in FIGS. 2A through 2C are assigned the same reference numerals, analogous but changed portions are assigned the same reference numerals accompanied by letter "b."

Figure 10B:
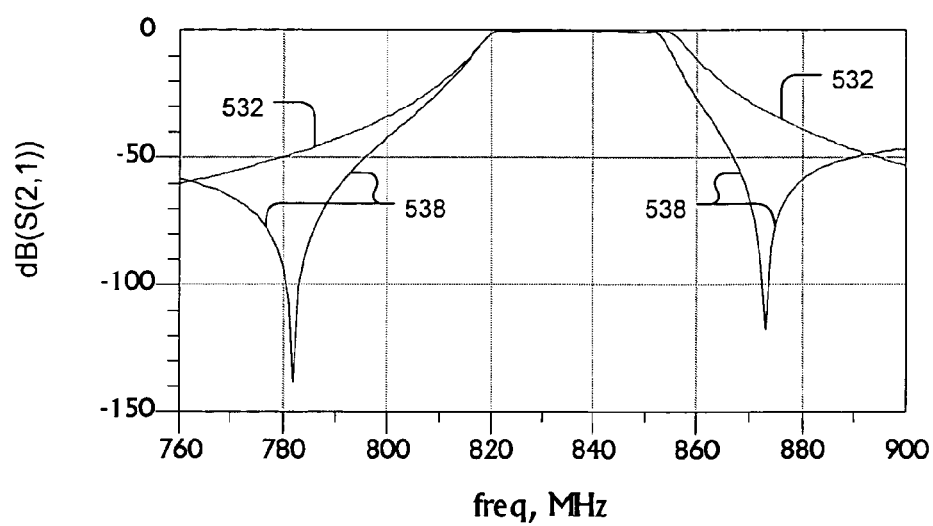
FIG. 10B is a band-pass characteristic curve of the apparatus of FIG. 10A.

Referring to FIGS. 10A and 10B, the filter apparatus 530 includes bridge capacitors 534 and 536. Here, the input signal line is connected to the bottom electrode of the first resonator 210b and the output signal line is connected to the bottom electrode of the fourth resonator 240b. The top electrodes of the first resonator 210b and the fourth resonator 240b are grounded as well as the bottom electrodes of the floating resonators 220b and 230b.

The first bridge capacitor 534 connects the input signal line with the top electrode of the second resonator 220b of the first coupled-resonator pair (210b and 220b). The second bridge capacitor 536 connects the output signal line with the top electrode of the third resonator 230b of the second coupled-resonator pair (230b and 240b). These bridge capacitors 534 and 536 are connected to the electrodes with opposite phase in the coupled-resonator pairs. The bridge capacitors 534 and 536 provide a connection for electrical current which has opposite phase compared to current generated by acoustic coupling at the desired frequency. That is electrical current through the capacitors 534 and 536 has oppose phase compared to the phase of the electrical current induced by acoustic coupling.

Because these two electrical current are out of phase they cancel each other resulting a transmission zero (a null) at each edge of the pass band 532. By adjusting the value of the bridge capacitors 534 and 536, frequency location of the null can be moved closer to the sides, or the edges, of the pass band 532 creating sharper roll-off resulting in the band-pass characteristic, for the filter apparatus 530, as illustrated by band-pass characteristic curve 538 including, again, a sharper roll-off at lower range and at upper range of the band-pass frequency range. For the illustrated frequencies, the bridge capacitors 534 and 536 have values in the order of tenths of pico-Farads or less, for example 0.5 pico-Farads or less.

Figure 11:
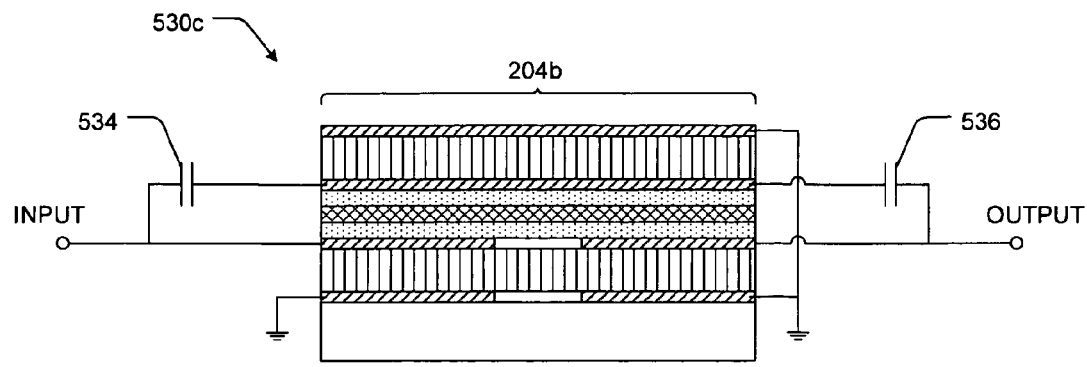
FIG. 11 is an apparatus in accordance with eighth embodiment of the present invention.

FIG. 11 illustrates a filter apparatus 530c that is an alternative embodiment of the filter apparatus 530 of FIG. 10A. In fact, the filter apparatus 530c has similar components as the filter apparatus 530 but the components are connected differently to achieve the same effect. In FIG. 11, for the filter apparatus 530c, the input signal line is connected to the top electrode of the first resonator 210b and the output signal line is connected to the top electrode of the fourth resonator 240b. The bottom electrodes of the first resonator 210b and the fourth resonator 240b are grounded as well as the top electrodes of the floating resonators 220b and 230b. The first bridge capacitor 534 connects the input signal line with the bottom electrode of the second resonator 220b of the first coupled-resonator pair (210b and 220b). The second bridge capacitor 536 connects the output signal line with the bottom electrode of the third resonator 230b of the second coupled-resonator pair (230b and 240b). There, the roll-off effect realized is the same as the roll-off effect illustrated in FIG. 10B and discussed above.

Figure 12:
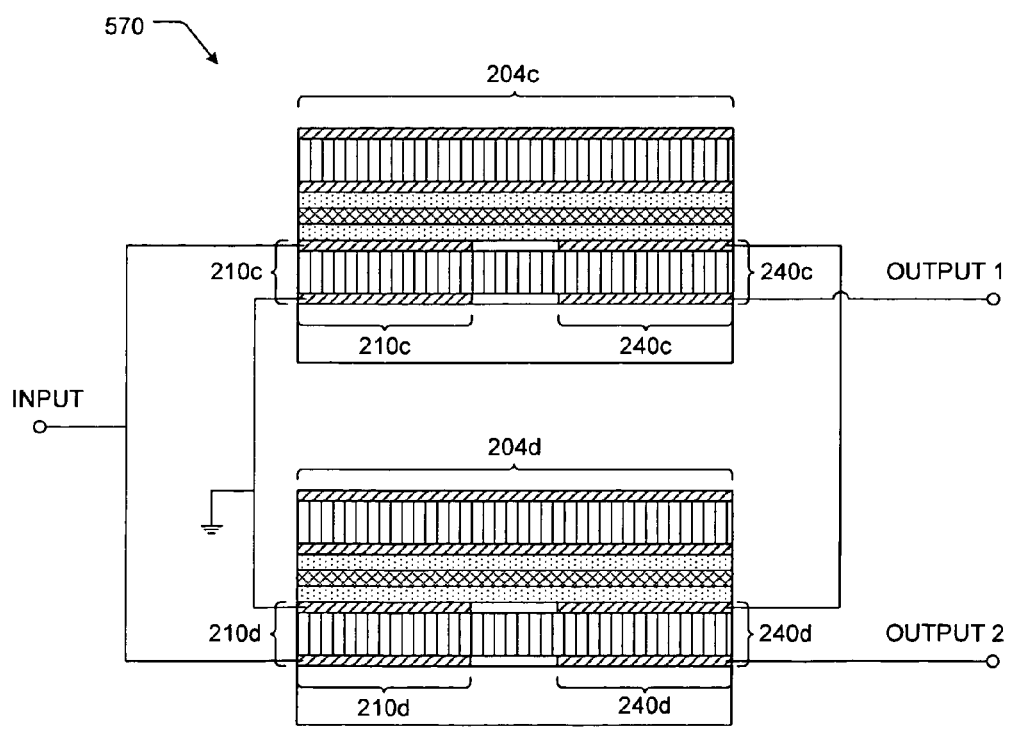
FIG. 12 is an apparatus in accordance with ninth embodiment of the present invention.

FIG. 12 illustrates a filter apparatus 570 illustrating yet another application of the two-stage resonator filter of the present invention. The filter apparatus 570 includes a first two-stage resonator filter 204c and a second two-stage resonator filter 204d connected in parallel to provide a singled ended input to balanced output. Each of the two-stage resonator filters 204c and 204d has similar configuration as the two-stage resonator filters 204 of FIGS. 2A through 2C. Each of the two-stage resonator filters 204c and 204d provides 100 ohms of input and output impedance.

Here, the two-stage resonator filters 204c and 204d, combined in parallel, provide a 50 ohm single input impedance line and a differential output lines of 100 ohms impedance each for a total combined 200 ohm impedance output. These output lines OUTPUT 1 and OUTPUT 2 can be fed into an amplifier that usually require 200 ohm impedance matching differential input thereby providing a 1-4 input-to-output impedance transformation. These impedance values are for example only, and other values of impedance transformation can be realized.

Further, unbalance-to-balanced to signal transformation is possible using the filter apparatus 570. As illustrated, the input signal line is connected to the top electrode of the first resonator 210c of the first two-stage resonator filter 204c while connected to the bottom electrode of the first resonator 210d of the second two-stage resonator filter 204d. At the same time, the first output signal line OUTPUT 1 is connected to the bottom electrode of the fourth resonator 240c of the first two-stage resonator filter 204c and the second output signal line OUTPUT 2 is connected to the bottom electrode of the fourth resonator 240d of the second two-stage resonator filter 204d. In this configuration, the output signals at OUTPUT 1 and the OUTPUT 2 form a balanced output.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. A single-chip duplexer comprising:
   a first two-stage resonator filter configured to pass electrical signal having a frequency within a first range of frequencies, said first two-stage resonator filter including an input resonator, an output resonator, and two floating resonators, each resonator including piezoelectric material;
   a second two-stage resonator filter configured to pass electrical signal having a frequency within a second range of frequencies, said second two-stage resonator filter including an input resonator, an output resonator, and two floating resonators, each resonator including piezoelectric material;
   wherein a lower common piezoelectric layer is shared by said first two-stage resonator filter and by said second two-stage resonator filter; and
   wherein an upper common piezoelectric layer is shared by said first two-stage resonator filter and by said second two-stage resonator filter.

2. The single-chip duplexer recited in claim 1 wherein the first range of frequencies is within the order of one to two Giga hertz.

3. The single-chip duplexer recited in claim 1 wherein a decoupling layer is shared by said first two-stage resonator filter and by said second two-stage resonator filter.

4. An apparatus comprising:
a two-stage resonator filter connected to two input signal lines and two output signal lines, said two-stage resonator filter comprising:
a first stage including an input resonator fabricated proximal to a substrate, the two input signal lines coupled to the input resonator; and a first floating resonator fabricated above the input resonator distal from the substrate;
a second stage including an output resonator fabricated proximal to the substrate, the two output signal lines coupled to the output resonator; and a second floating resonator fabricated above the output resonator distal from the substrate;
a decoupling layer between said input resonator and said first floating resonator, said decoupling layer extending between said second floating resonator and said output resonator;
at least one of
a first shunt resonator across the input signal lines;
a second shunt resonator across the output signal lines;
a first series resonator along its input signal lines; and
a second series resonator along its output signal lines.

5. An apparatus comprising:
a two-stage resonator filter connected to two input signal lines and two output signal lines, said two-stage resonator filter comprising:
a first stage including an input resonator fabricated proximal to a substrate, the two input signal lines coupled to the input resonator; and a first floating resonator fabricated above the input resonator distal from the substrate;
a second stage including an output resonator fabricated proximal to the substrate, the two output signal lines coupled to the output resonator; and a second floating resonator fabricated above the output resonator distal from the substrate;
a decoupling layer between said input resonator and said first floating resonator, said decoupling layer extending between said second floating resonator and said output resonator;
a first bridge capacitor bridging the input signal line and the second resonator; and
a second bridge capacitor bridging the output signal line and the third resonator.

6. The apparatus recited in claim 5, wherein
a first of the two input signal lines is coupled to the input resonator through a first connection pad located on the substrate; and
a first of the two output signal lines is coupled to the output resonator through a second connection pad located on the substrate, the first connection pad being independent of the second connection pad.

* * * * *